(12) United States Patent
Kim et al.

(10) Patent No.: US 8,242,797 B2
(45) Date of Patent: Aug. 14, 2012

(54) CANTILEVER-TYPE MICRO CONTACT PROBE WITH HINGE STRUCTURE

(75) Inventors: Jung-Yup Kim, Daejeon (KR); Hak-Joo Lee, Daejeon (KR); Kyung-Shik Kim, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 306 days.

(21) Appl. No.: 12/452,730

(22) PCT Filed: Feb. 24, 2009

(86) PCT No.: PCT/KR2009/000875
§ 371 (c)(1),
(2), (4) Date: Jan. 19, 2010

(87) PCT Pub. No.: WO2010/002091
PCT Pub. Date: Jan. 7, 2010

(65) Prior Publication Data
US 2010/0127728 A1 May 27, 2010

(30) Foreign Application Priority Data
Jun. 30, 2008 (KR) .................. 10-2008-0062492

(51) Int. Cl.
*G01R 31/02* (2006.01)

(52) U.S. Cl. ............... 324/762.01; 324/500; 324/755.07
(58) Field of Classification Search .................. None
See application file for complete search history.

(56) References Cited

U.S. PATENT DOCUMENTS 6,127,832 A * 10/2000 Comulada et al. ....... 324/755.07

FOREIGN PATENT DOCUMENTS

| JP | 1999-304835 | 11/1999 |
| JP | 2000-171381 | 6/2000 |
| JP | 2006-189370 | 7/2006 |
| JP | 2007-218890 | 8/2007 |
| JP | 2009-300218 | 12/2009 |
| KR | 10-2008-0028274 | 3/2008 |

* cited by examiner

*Primary Examiner* — Melissa Koval
*Assistant Examiner* — Trung Nguyen
(74) *Attorney, Agent, or Firm* — Lexyoume IP Meister, PLLC.

(57) ABSTRACT

According to the present invention, allowable displacement can be increased from an excellent stress relaxation effect achieved by applying a hinge structure while adopting advantages of a dual beam cantilever-type probe that can reduce scrub. Since the hinge structure is a structure that does not receive a moment, an effect that is the same as eliminating a moment in a conventional prove can be achieved so that stress can be evenly applied and the allowable displacement of the probe can be increased.

14 Claims, 7 Drawing Sheets

CANTILEVER-TYPE MICRO CONTACT PROBE WITH HINGE STRUCTURE

TECHNICAL FIELD

The present invention relates to a micro contact probe used in a probe card. More particularly, the present invention relates to a cantilever-type micro contact probe having a dual beam structure.

BACKGROUND ART

As technology has been developed, semiconductor chips have been highly integrated. In general, a semiconductor chip fabricated through a micro-fabrication process undergoes an electrical test before packaging process to sort out defective products. For the electrical test, a probe card is used to connect between a tester and an electrode pad of the semiconductor chip.

A probe (also known as a contactor or needle) installed in the probe card may be classified into a cantilever type and a vertical type. The probe should have a structure that can absorb a step difference between the electrode pads, and at the same time should eliminate native oxides on the electrode pad.

In order to satisfy these requirements, a micro contact probe having a simple single beam shape as shown in FIG. 1 has been conventionally disclosed as a typical cantilever-type probe. As shown in FIG. 1, the conventional cantilever-type micro contact probe is formed of a connection portion 101 connected to a probe card (not shown), an extending portion 103 extending in a side direction from the connection portion 101, and a contact portion 105 having a tip 107 formed to protrude from an end portion of the extending portion 103 to contact a pad of a semiconductor chip.

As shown in FIG. 1, the cantilever-type micro contact probe has a single beam because the connection portion 101 of the conventional cantilever-type micro contact probe is extended in the up and down direction, that is, a vertical direction, and the extending portion 103 is extending in the left and right direction, that is, a horizontal direction.

Since the conventional cantilever-type micro contact probe is formed in the single beam shape, stress concentration may easily occur so that plastic deformation is easily generated. In addition, the conventional cantilever-type micro contact probe cannot be used for a small electrode pad due to an excessive scrub length.

In order to overcome the drawbacks of the cantilever-type micro contact probe having a single beam, the cantilever-type micro contact probe having a dual beam of FIG. 2 and FIG. 3 have been disclosed.

As shown in FIG. 2, the conventional cantilever-type micro contact probe having a dual beam is formed of a connection portion 111 connected to a probe card (not shown), an extending portion 113 extending in a side direction from the connection portion 111, and a contact portion 115 having a tip 117 formed to protrude from an end portion of the extending portion 113 to contact a pad of a semiconductor chip.

In FIG. 2, the extending portion 113 includes an upper beam 113a and a lower beam 113b arranged up and down, and the extending portion 113 has a dual beam shape by forming a long slit-shape opening 113c between the upper and lower beams 113a and 113b.

According to the conventional cantilever-type micro contact probe having a dual beam of FIG. 2, when the tip 117 of the contact portion 115 contacts the electrode pad of the semiconductor chip so that a load is applied to the probe during testing of the semiconductor chip, the length of the scrub may be reduced compared to the conventional probe of FIG. 1.

However, the conventional cantilever-type micro contact probe having a dual beam of FIG. 2 may have a stress concentration problem when the probe is deformed due to external force.

As shown in FIG. 3, a conventional cantilever-type micro contact probe having a bellows-shaped dual beam is formed of a connection portion 121 connected to a probe card (not shown), an extending portion 123 extending in a side direction from the connection portion 121, and a contact portion 125 having a tip 127 formed to protrude from an end portion of the extending portion 123 to contact an electrode pad of a semiconductor chip.

In FIG. 3, the extending portion 123 includes an upper beam 123a and a lower beam 123b arranged up and down, and the extending portion 123 has a dual beam shape by forming a long slit-shape opening 123c between the upper and lower beams 123a and 123b.

In this case, the shape of the extending portion 123 has a bellow-shaped dual beam that bends in different directions while having at least one inflection point rather than having a straight dual beam shape, as shown in FIG. 2.

According to the conventional cantilever-type micro contact probe having a dual beam of FIG. 3, when the tip 127 of the contact portion 125 contacts the electrode pad of the semiconductor chip so that a load is applied to the probe during testing of the semiconductor chip, the length of the scrub may be reduced compared to the conventional probe of FIG. 1, and particularly, out of plane behavior and stress concentration can be reduced because the extending portion 123 has the bellows shape.

However, the conventional cantilever-type micro contact probe having a bellows shaped dual beam shown in FIG. 3 needs to have more stress relaxation when the probe is deformed due to external force, and it cannot be easily designed due to too many design variables and the complicated shape.

The above information disclosed in this Background section is only for enhancement of understanding of the background of the invention and therefore it may contain information that does not form the prior art that is already known in this country to a person of ordinary skill in the art.

DISCLOSURE

Technical Problem

The present invention has been made in an effort to provide a dual beam cantilever-type micro contact probe with a hinge structure that does not receive a moment to thereby prevent stress concentration that occurs from deformation.

Technical Solution

A cantilever-type micro contact probe according to an exemplary embodiment of the present invention includes: a connection portion connected to a probe card; an extending portion extending in a side direction from the connection portion and having a dual beam; a contact portion having a tip formed to protrude from an end portion of the extending portion to contact an electrode pad of the semiconductor chip; and a hinge portion that is provided between the extending portion and the contact portion and does not transmit a moment from the contact portion to the extending portion.

The hinge portion may include a convex portion and a recess portion that correspond to each other in shape, and the convex portion may become the center of rotation when the micro contact probe is deformed due to external force and the recess portion guides the convex portion.

The hinge portion may form a gap between the convex portion and the recess portion so that the convex portion and the recess portion can be maintained being separated from each other when no external force is applied to the micro contact probe.

The hinge portion may further include a protruding portion formed by being extended from the extending portion to surround the convex portion.

The extending portion includes a first beam and a second beam arranged up and down, and an opening is formed between the first and second beams.

At least one of the first and second beams may have a bellows shape that is bent while having at least one inflection point.

The hinge portion may be formed between the second beam of the extending portion and the contact portion.

The hinge portion may form a hinge structure by having a convex portion and a recess portion that correspond to each other in shape and forming a gap between the recess portion and the convex portion, and may maintain the second beam of the extending portion and the contact portion to be separated from each other when no external force is applied to the micro contact probe.

The hinge portion may further include a protruding portion formed by being extended from the recess portion to surround to convex portion.

The convex portion may be formed in one of the second beam of the extending portion and the contact portion, and the recess portion is formed in the other one.

In the extending portion, an imaginary line that connects an end portion of a connection portion of the first beam and an end portion of the contact portion and an imaginary line that connects an end portion of a connection portion of the second beam and an end portion of the contact portion may be set to cross each other.

The connection portion and the extending portion may be made of a metal material selected from a group including nickel, a nickel alloy, and phosphor bronze, and the contact portion is made of a metal material selected from a group including cobalt, a cobalt alloy, rhodium, a rhodium alloy, and an alloy thereof.

A cantilever-type micro contact probe extending in a side direction and having a fixed first end and an unfixed second end, may include a hinge structure that does not transmit a moment that is generated when an external load is applied to the second end of the micro contact probe, to the first end.

Advantageous Effects

According to the present invention, a dual beam cantilever-type micro contact probe with a hinge structure that does not receive a moment is provided to prevent stress concentration that occurs from deformation of the micro contact probe.

The hinge structure transmits force without transmitting a moment, and therefore a portion where the hinge structure is formed does not receive the moment, and accordingly it provides an effect of removing only a moment from a conventional probe. Resultantly, stress concentration due to the moment can be completely prevented.

Such a structure has an advantage of efficiently preventing stress concentration while still adopting advantages of the conventional dual beam, which are the scrub reducing effect of the dual beam cantilever-type micro contact probe and the out of plane behavior prevention effect that can be achieved by forming a curved portion in the dual beam to form the bellows shape.

DESCRIPTION OF REFERENCE NUMERALS INDICATING PRIMARY ELEMENTS IN THE DRAWINGS

| | |
|---|---|
| 11, 21, 31, 41: connection portion | 13, 23, 33, 43: extending portion |
| 13a, 23a, 33a, 43a: upper beam | 13b, 23b, 33b, 43b: lower beam |
| 13c, 23c, 33c, 43c: opening | 14, 24, 34, 44: gap |
| 15, 25, 35, 45: contact portion | 16a, 26a, 36a, 46a: convex portion |
| 16b, 26b, 36b, 46b: recess portion | 26c, 46c: protruding portion |
| 17, 27, 37, 47: tip | |

MODE FOR INVENTION

In the following detailed description, only certain exemplary embodiments of the present invention have been shown and described, simply by way of illustration. As those skilled in the art would realize, the described embodiments may be modified in various different ways, all without departing from the spirit or scope of the present invention.

Figure 1:
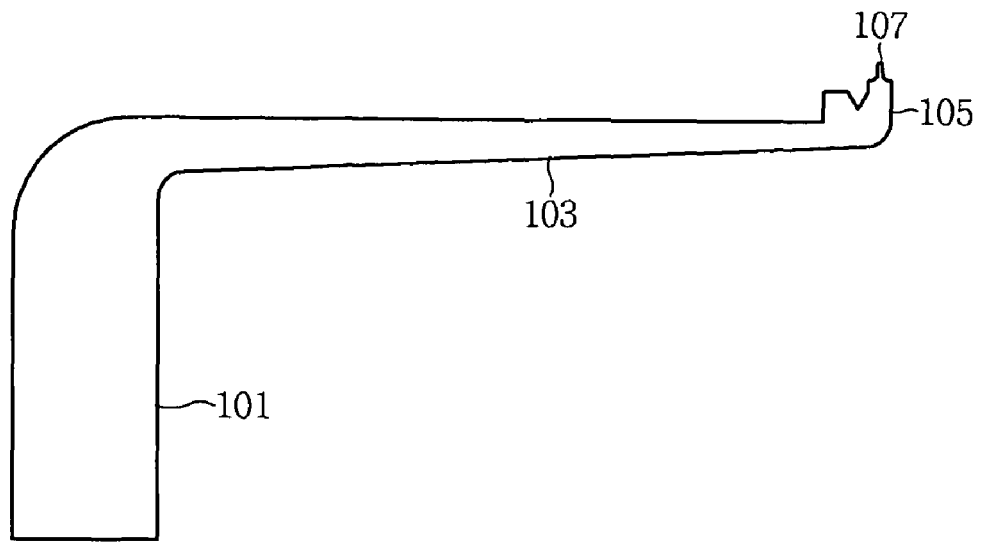
FIG. 1 shows a single cantilever-type micro contact probe according to a conventional art.
Figure 2:
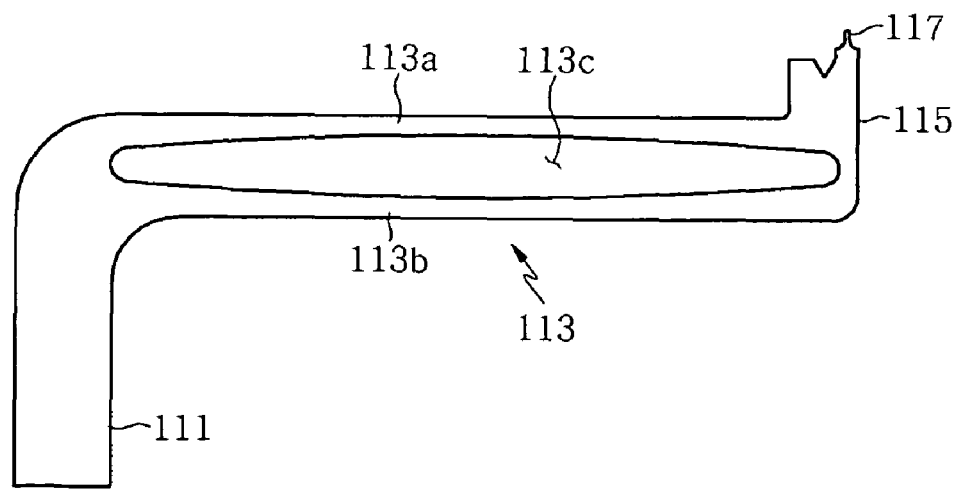
FIG. 2 shows a cantilever-type micro contact probe having a dual beam according to a conventional art.
Figure 3:
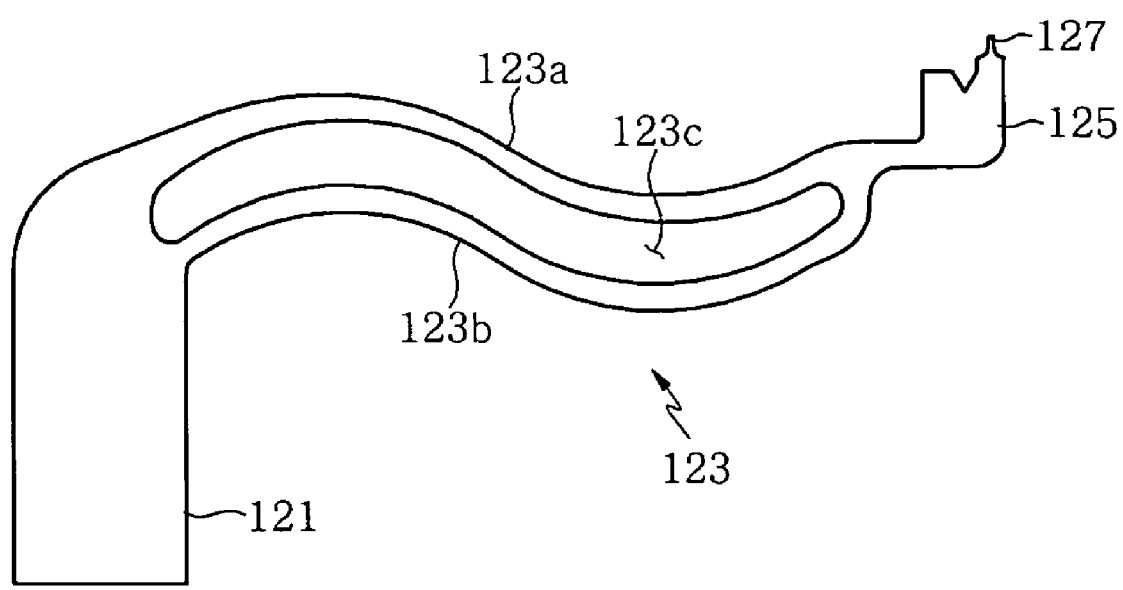
FIG. 3 shows a cantilever-type micro contact probe having a bellows-shaped dual beam according to a conventional art.
Figure 4:
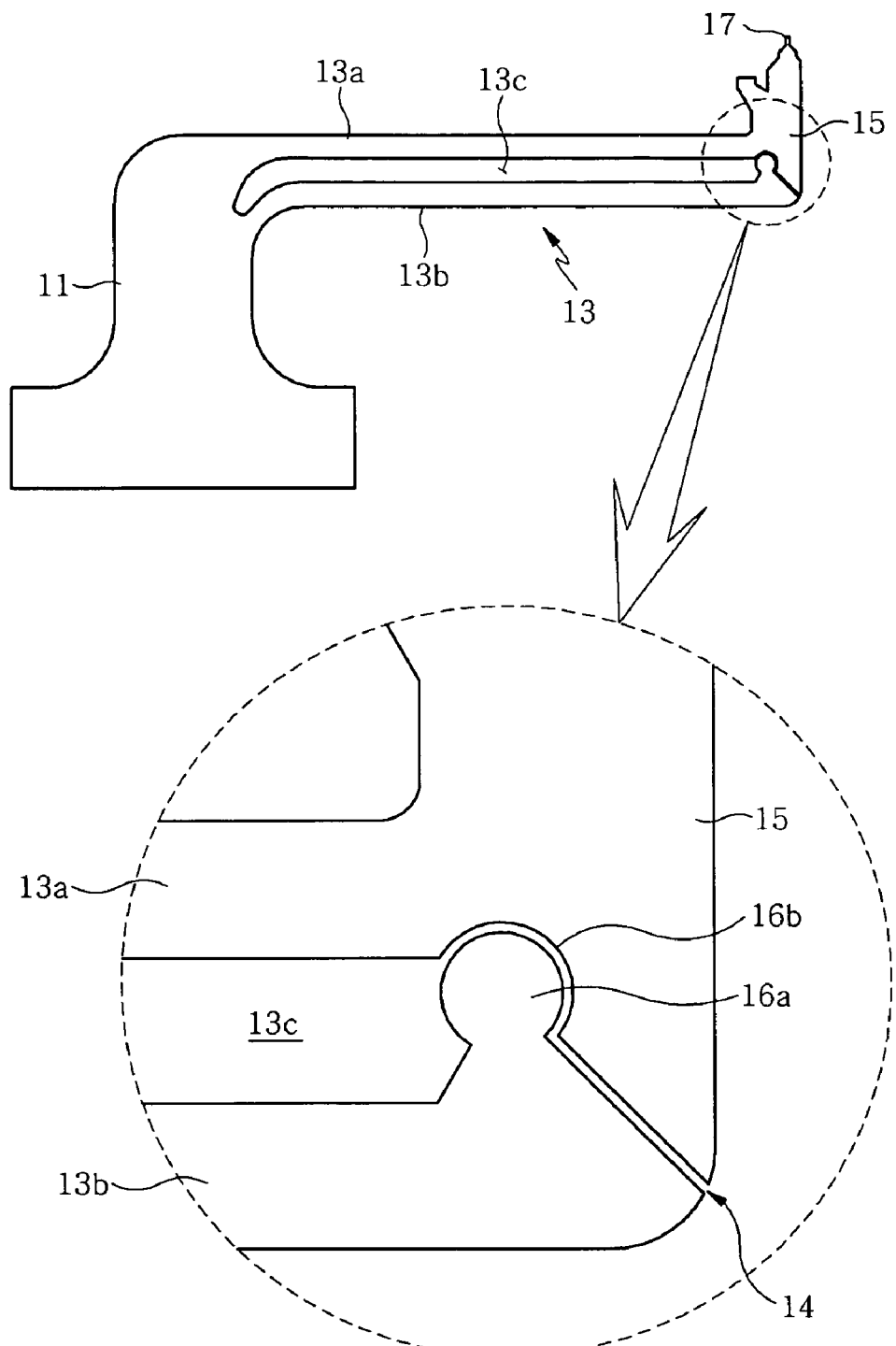
FIG. 4 shows a dual beam cantilever-type micro contact probe with a hinge structure according to a first exemplary embodiment of the present invention.
Figure 5:
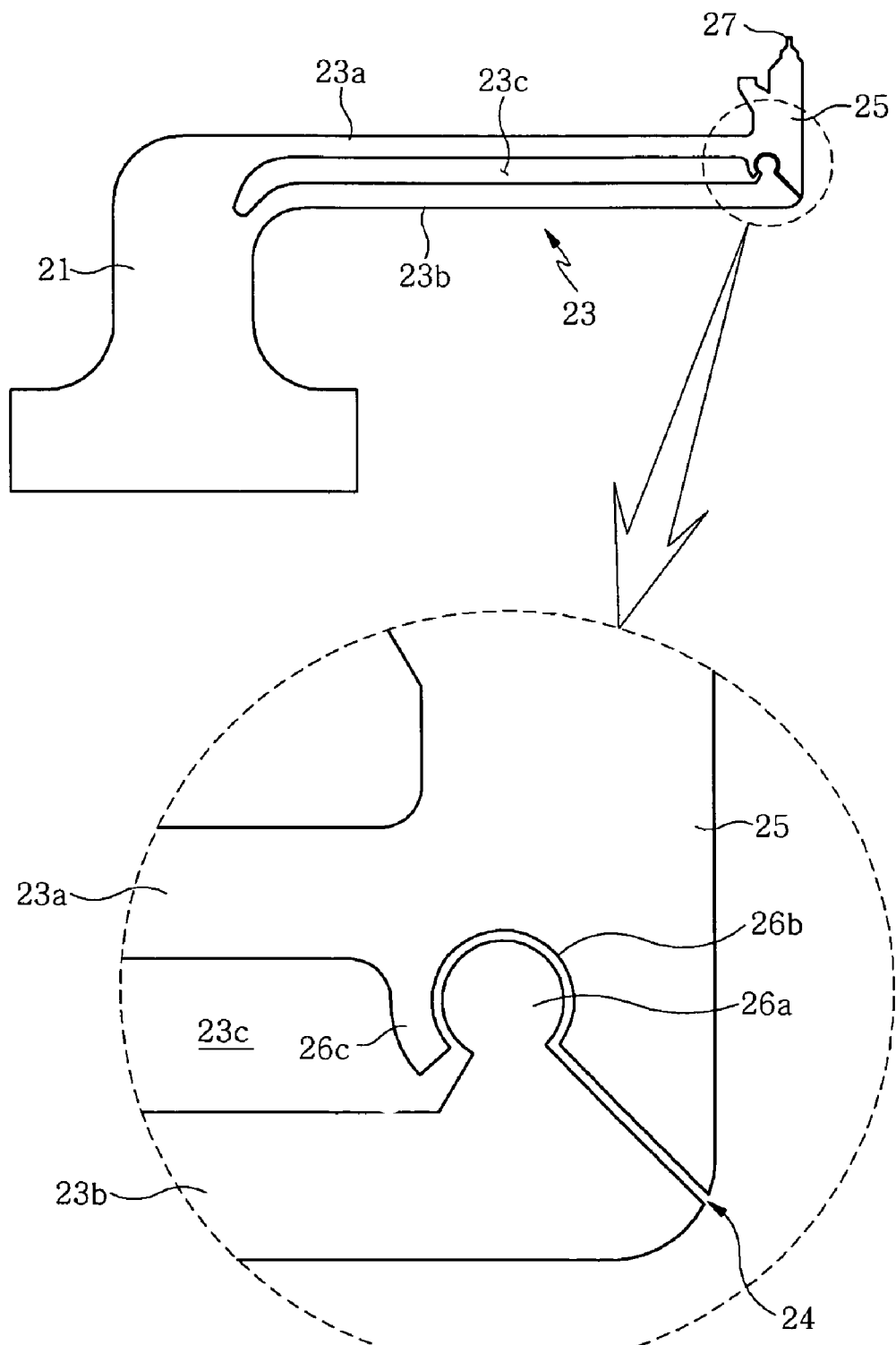
FIG. 5 shows a dual beam cantilever-type micro contact probe with a hinge structure according to a modified example of the first exemplary embodiment of the present invention.
Figure 6:
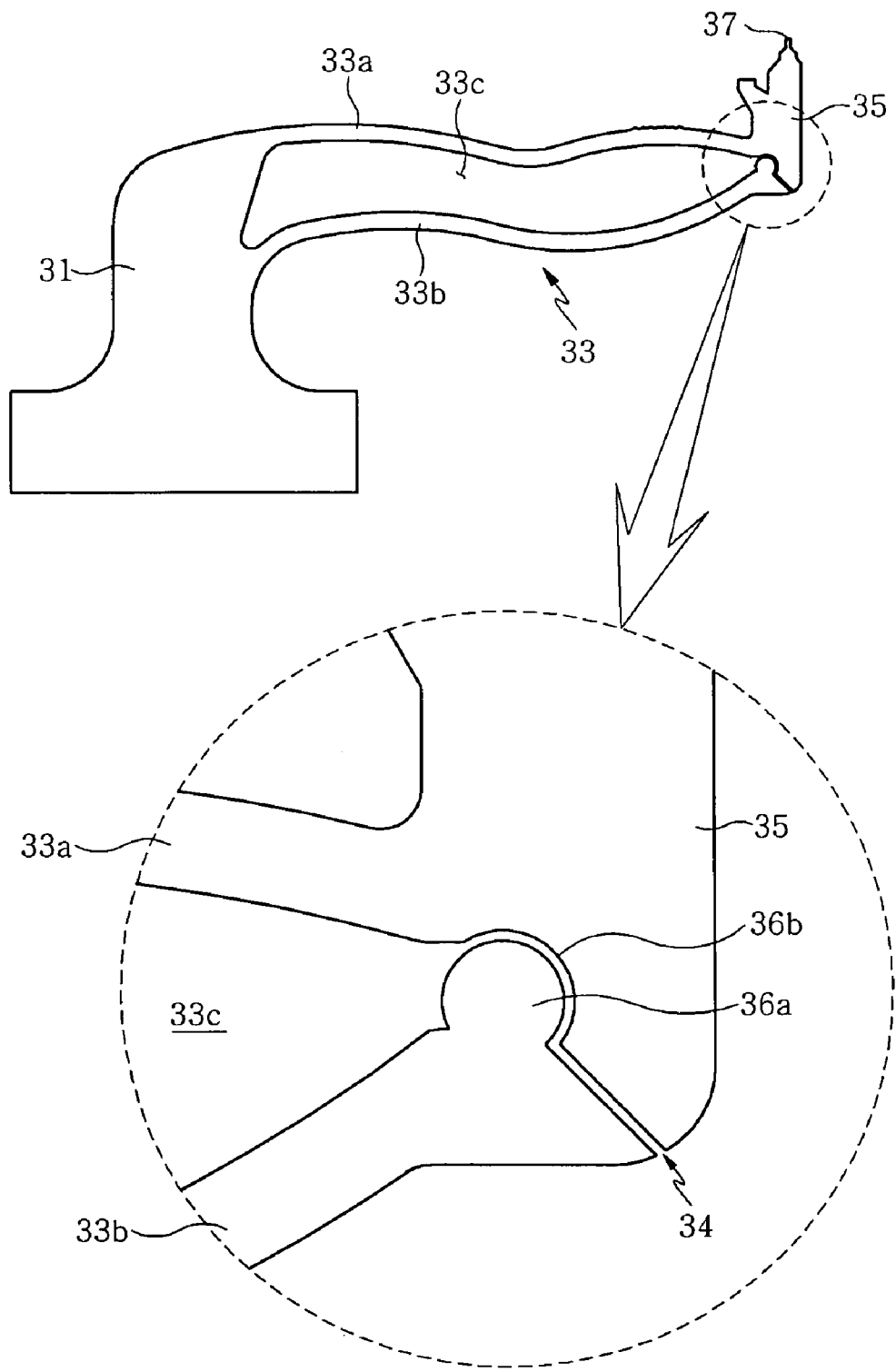
FIG. 6 shows a bellows-shaped dual beam cantilever-type micro contact probe with a hinge structure according to a second exemplary embodiment of the present invention.
Figure 7:
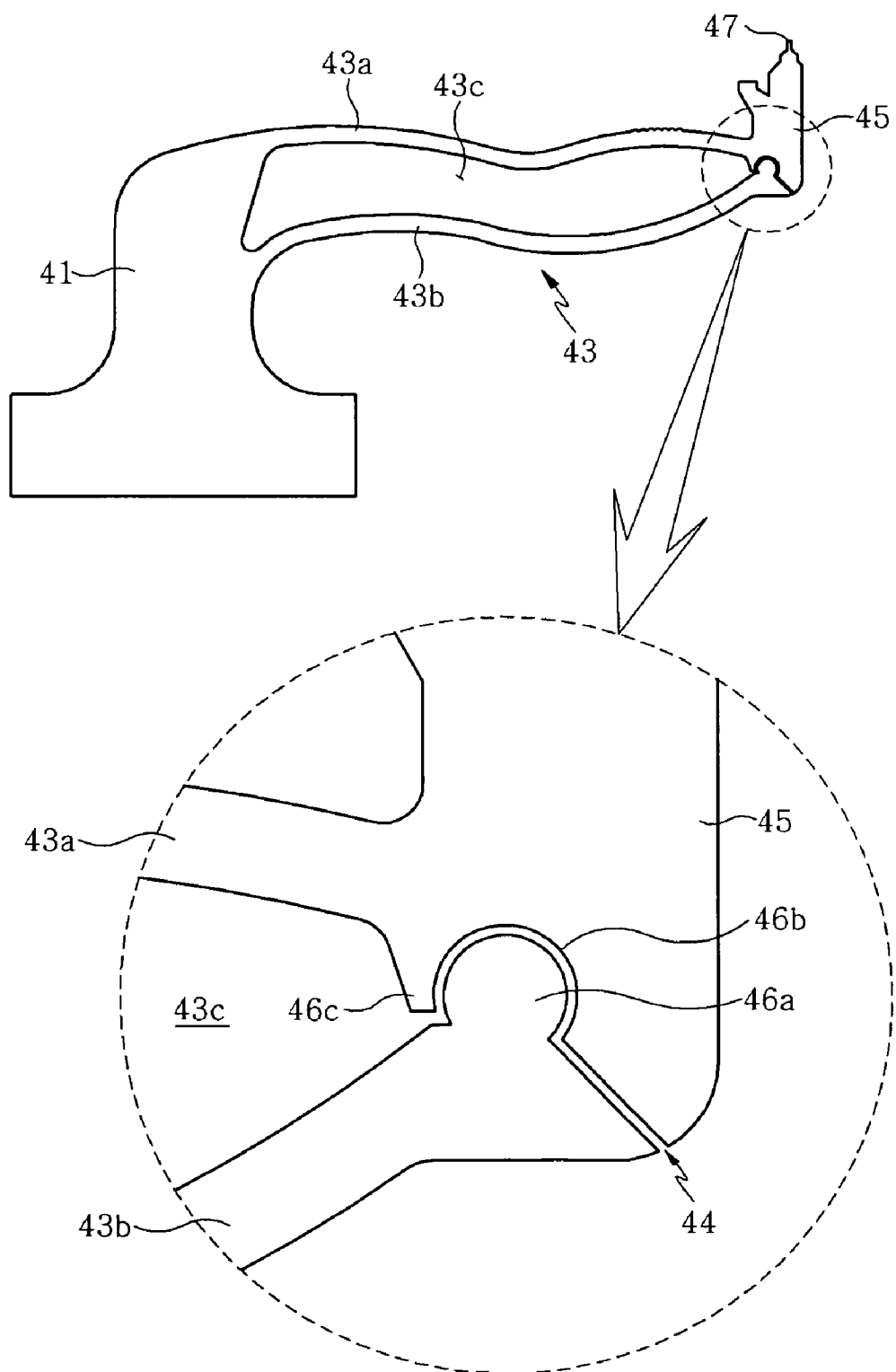
FIG. 7 shows a bellows-shaped dual beam cantilever-type micro contact probe with a hinge structure according to a modified example of the second exemplary embodiment of the present invention.
Figure 8:
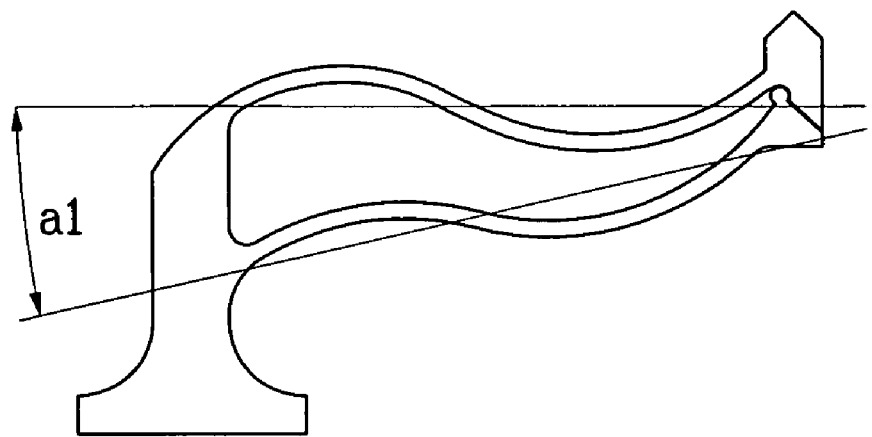
FIG. 8 is provided to describe a cantilever-type micro contact probe according to a third exemplary embodiment of the present invention.
Figure 9:
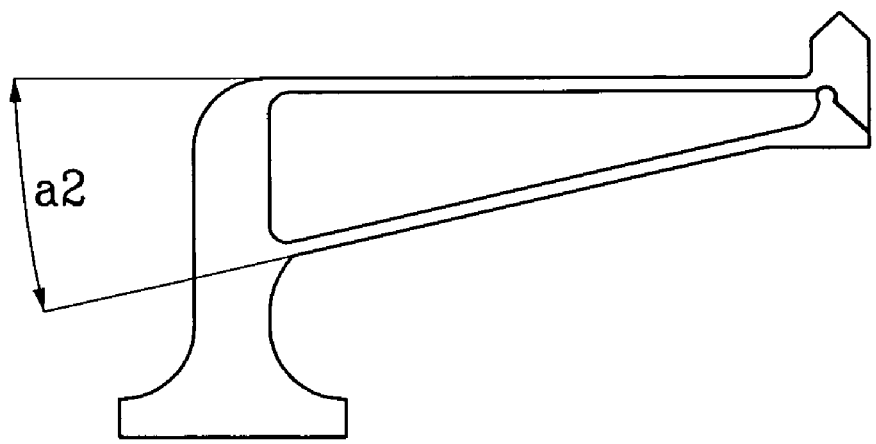
FIG. 9 is provided to describe a cantilever-type micro contact probe according to a fourth exemplary embodiment of the present invention.

FIG. 4 and FIG. 5 show dual beam cantilever-type micro contact probe with hinge structure according to a first exemplary embodiment and a modified example of the first exemplary embodiment of the present invention, FIG. 6 and FIG. 7 show bellows-shaped dual beam cantilever-type micro contact probe with hinge structure according to a second exemplary embodiment and a modified example of the second exemplary embodiment of the present invention, and FIG. 8 and FIG. 9 show cantilever-type micro contact probe according to a third exemplary embodiment of the present invention.

As shown in FIG. 4, a cantilever-type micro contact probe according to the first exemplary embodiment of the present invention includes a connection portion 11 connected to a probe card (not shown), an extending portion 13 extending in a side direction from the connection portion 11, and a contact portion 15 having a tip 17 that is formed protruding from an end portion of the extending portion 13 and contacts a semiconductor chip pad.

The extending portion 13 of the cantilever-type micro contact probe according to the present exemplary embodiment has a dual beam. That is, the extending portion 13 includes a first beam 13a and a second beam 13b arranged up and down, and a long slit-shaped opening 13 is formed between the first and second beams 13a and 13b. The opening 13c can be formed only within the extending portion 13, and it may be extended to the connection portion 11 or the contact portion 15 according to design.

In addition, the dual beam cantilever-type micro contact probe according to the present exemplary embodiment has a hinge portion between the extending portion 13 and the contact portion 15, and more particularly, between the second beam 13b of the extending portion 13 and the contact portion 15 as shown in a partially enlarged view of FIG. 4.

The hinge portion includes a convex portion 16a and a recess portion 16b that correspond to each other in shape, and when an external force is applied to the probe, the second beam 13b of the extending portion 13 and the contact 15 touch each other and form a hinge structure. When no external force is applied to the probe, a gap 14 is formed between the second beam 13b of the extending portion 13 and the contact portion 15 so that they can be maintained being separated.

The convex portion 16a serves as the center of rotation, and the recess portion 16b guides the convex portion 16a serving as the center of rotation. In FIG. 4, the convex portion 16a is formed in the second beam 13b of the extending portion 13 and the recess portion 16b is formed in the contact portion 15, but the present invention is not limited thereto. The recess portion may be formed in the second beam of the extending portion and the convex portion may be formed in the contact portion according to a modified example.

With the above-described configuration, in the cantilever-type micro contact probe according to the present exemplary embodiment, when the tip 17 of the contact portion 15 touches a pad of a semiconductor chip during examination of the semiconductor chip so that a load is applied to the probe, the first beam 13a connected with the contact portion 15 is firstly deformed. When displacement greater than the gap 14 occurs according to deformation of the first beam 13a, the extending portion 13 and the contact portion 15, that is, the second beam 13b of the extending portion 13 and the contact portion 15 contact each other, that the second beam 13b is deformed.

In this case, when the convex portion 16a contacts the recess portion 16b, force is transmitted from the contact portion 15 to the second beam 13b of the extending portion 13. However, only when displacement greater than the gap 14 occurs do the second beam 13b of the extending portion 13 and the contact portion 15 contact each other so that the force can be transmitted because the second beam 13b of the extending portion 13 and the contact portion 15 are not directly connected to each other due the gap 14 provided therebetween.

As in a conventional art, a structure in which an extending portion and a contact portion directly contact each other receives a moment when force is applied during examination of the semiconductor chip so that stress is concentrated in a portion where a first beam and a second beam meet each other.

However, as in the present exemplary embodiment, a hinge structure is formed between the extending portion 13 and the contact portion 15 so that the moment is not transmitted even though force is applied, thereby significantly reducing stress concentration.

As shown in FIG. 5, as in the first exemplary embodiment, a cantilever-type micro contact probe according to exemplary variation of the first exemplary embodiment of the present invention is formed of a connection portion 21 connected to a probe card (not shown), an extending portion 23 extending in a side direction from the connection portion 21, and a contact portion 25 having a tip 17 that is formed protruding from an end portion of the extending portion 13 and that contacts a semiconductor chip pad.

In addition, the extending portion 23 of the cantilever-type micro contact probe according to the present exemplary variation includes a first beam 23a and a second beam 23b arranged up and down, and has a dual beam shape where a lone slit-shaped opening 23c is formed between the first and second beams 23a and 23b.

In addition, as shown in a partially enlarged view of FIG. 5, the dual beam cantilever-type micro contact probe according to the present exemplary variation has a hinge portion including a gap 24, a convex portion 26a, and a recess portion 26b between the extending portion 23 and the contact portion 23, and more particularly, between the second beam 23b of the extending portion 23 and the contact portion 25.

According to the first exemplary embodiment, the recess portion 16b has an approximately semi-circle shape so that it surrounds approximately a half of the convex portion 16, but according to the present exemplary variation, a protruding portion 26c is formed in a portion where the first beam 23a and the contact portion 25 are connected to each other so that the recess portion 26b can be extended. Accordingly, compared to the recess portion 26b of the first exemplary embodiment, a recess portion 26b according to a second exemplary embodiment of the present may be formed to surround more than a half of the convex portion 26a, and a hinge structure can be more stably formed.

For normal operation of the hinge, it is preferred that the protruding portion 26c is separated by more than a predetermined distance from the second beam 23b in order to prevent the end of the protruding portion 26 from being interfered with by the second beam 23b when the probe is deformed.

In FIG. 5, the convex portion 26a is formed in the second beam 23b of the extending portion 23 and the recess portion 26b is formed in the contact portion 25, but the present invention is not limited thereto. The recess portion 26b may be formed in the second beam 23b of the extending portion 23 and the convex portion 26a may be formed in the contact portion 25.

As described above, by providing the hinge structure between the extending portion 23 and the contact portion 25 according to the exemplary variation of the first exemplary embodiment of the present invention, a moment is not transmitted even though force is applied so that stress concentration can be significantly reduced.

As shown in FIG. 6, a cantilever-type micro contact probe according to a second exemplary embodiment of the present invention is formed of a connection portion 31 connected to a probe card (not shown), an extending portion 33 extending in a side direction from the connection portion 31, and a contact portion 35 having a tip 37 that is formed to protrude from an end portion of the extending portion 33 and contacts a pad of a semiconductor chip, as in the first exemplary embodiment of the present invention.

In addition, as shown in FIG. 6, the extending portion 33 of the cantilever-type micro contact probe according to the present exemplary embodiment includes a first beam 33a and a second beam 33b arranged up and down, and has a dual beam structure wherein a long slit-shaped opening 33 is formed between the first and second beams 33a and 33b.

In addition, as shown in a partially enlarged view of FIG. 6, the dual beam cantilever-type micro contact probe according to the present exemplary variation has a hinge portion including a gap 34, a convex portion 36a, and a recess portion 36b between the extending portion 33 and the contact portion 33, and more particularly, between the second beam 33b of the extending portion 33 and the contact portion 35.

In FIG. 6, the convex portion 36a is formed in the second beam 33b of the extending portion 33 and the recess portion 36b is formed in the contact portion 35, but the present invention is not limited thereto. The recess portion 36b may be formed in the second beam 33b of the extending portion 33 and the convex portion 36a may be formed in the contact portion 35.

According to the cantilever-type micro contact probe of the present exemplary embodiment, the extending portion has a bellows-shape dual beam structure that is bent in different directions while having at least one inflection point rather than having an approximately straight dual beam shape as in the first exemplary embodiment and the exemplary variation thereof.

In FIG. 6, the extending portion 33 is formed of the first beam 33a and the second beam 33b respectively shaped in different patterns, but the first beam and the second beam may be shaped in the same pattern when forming the bellows-shaped extending portion according to the second exemplary embodiment of the present invention.

That is, when the extending portion is formed of first and second beams shaped in the same pattern, the location of an inflection point where curve directions of the first and second beams are changed and a slope of a tangent line at the inflection point may be the same. In addition, when the extending portion is formed of first and second beams shaped in different patterns, at least one or both of the location of the inflection point where curve directions of the first and second beams are changed and the slope of the tangent line at the inflection point may be changed.

In addition, instead of shaping the first and second beams in a bellows pattern, at least one of the first and second beams may be formed in the bellows pattern.

As shown in FIG. 6, if the dual beam micro contact probe has the bellows-shape pattern, a scrub length can be decreased and at the same time out of plane behavior can be prevented. When the out of plane behavior occurs an adjacent probe may be interfered with, and therefore a possibility of occurrence of the out of plane behavior should be eliminated in design.

The out of plane behavior occurs when in-plane bending stiffness is smaller than out of plane bending stiffness, and the out of plane behavior frequently occurs due to a process error that is inevitably generated during a fabrication process of the probe. However, since the probe having the bellows-shape dual beam shape according to the second exemplary embodiment has a characteristic that can reduce the in-plane stiffness without regard to variation of the out-of plane stiffness, the out of plane behavior can be prevented. Therefore, according to the second exemplary embodiment, the in-plane stiffness is small even when the probe has a process error so that the out of plane behavior can be prevented.

The bellows-shape dual beam probe according to the second exemplary embodiment can ease stress, decrease scrub, and prevent the out of plane behavior at the same time. In addition, as described above, when the hinge structure is formed between the extending portion 33 and the contact portion 35 according to the present exemplary embodiment, a moment is not transmitted even though force is applied so that stress concentration can be significantly reduced.

In addition, the cantilever-type micro contact probes according to the present exemplary embodiment can be manufactured by using an electrodeposition method so that a complex bellows shape can be easily manufactured.

As shown in FIG. 7, a cantilever-type micro contact probe according to an exemplary variation of the second exemplary embodiment of the present invention is formed of a connection portion 41 connected to a probe card (not shown), an extending portion 43 extending in a side direction from the connection portion 41, and a contact portion 45 having a tip 47 that is formed to protrude from an end portion of the extending portion 43 and that contacts a pad of a semiconductor chip, as in the second exemplary embodiment of the present invention.

In addition, the extending portion 43 of the cantilever-type micro contact probe according to the present exemplary variation has a bellows shape, and, as shown in FIG. 7, it includes a first beam 43a and a second beam 43b arranged up and down, and has a dual beam structure where a long slit-shaped opening 43 is formed between the first and second beams 43a and 43b.

In addition, as shown in a partially enlarged view of FIG. 7, the dual beam cantilever-type micro contact probe according to the present exemplary variation has a hinge portion including a gap 44, a convex portion 46a, and a recess portion 46b between the extending portion 43 and the contact portion 43, and more particularly, between the second beam 43b of the extending portion 43 and the contact portion 45.

According to the second exemplary embodiment, the recess portion 36b has an approximately semi-circle shape so that it surrounds approximately a half of the convex portion 36, but according to the present exemplary variation, a protruding portion 46c is formed in a portion where the first beam 43a and the contact portion 45 are connected to each other so that the recess portion 46b can be extended. Accordingly, compared to the recess portion 46b of the second exemplary embodiment, a recess portion 46b according to the present exemplary variation may be formed to surround more than a half of the convex portion 46a, and a hinge structure can be more stably formed.

For normal operation of the hinge, it is preferred that the protruding portion 46c is separated by more than a predetermined distance from the second beam 43b in order to prevent the end of the protruding portion 46 from being interfered with by the second beam 43b when the probe is deformed.

In FIG. 7, the convex portion 46a is formed in the second beam 43b of the extending portion 43 and the recess portion 46b is formed in the contact portion 45, but the present invention is not limited thereto. The recess portion 46b may be formed in the second beam of the extending portion and the convex portion may be formed in the contact portion.

As described above, by providing the hinge structure between the extending portion 23 and the contact portion 25 according to the present exemplary variation, a moment is not transmitted even though a force is applied so that stress concentration can be significantly reduced.

FIG. 8 and FIG. 9 show cantilever-type micro contact probes according to third and fourth exemplary embodiments of the present invention. FIG. 8 and FIG. 9 are provided to describe that angles a1 and a2 are set between a first beam and a second beam of the dual beam cantilever-type micro contact probe. FIG. 8 shows a probe having a bellows-type extending portion and FIG. 9 shows a probe having a straight extending portion. Although a hinge portion is not shown in FIG. 8 and FIG. 9, the micro contact probes according to the present exemplary embodiments may have a hinge portion having the same structure as the hinge portion shown in FIG. 4 to FIG. 7.

According to the cantilever-type micro contact probe of the present exemplary embodiments, when a tip of a contact portion contacts a pad of the semiconductor chip so that a load is applied to the probe during examination of the semiconductor chip, the scrub length may be reduced compared to a conventional probe.

In the dual beam cantilever-type micro contact probe, rotation movement that is opposite to behavior of a probe tip having an arc shape can be generated by setting a scrub length of a second beam to be greater than that of a first beam. Resultantly, the scrub can be suppressed.

As described, as shown in FIG. 8 and FIG. 9, an inclination angle a1 or a2 may be provided between the first and second beams in order to set the scrub length of the second beam to be greater than that of the first beam. Alternatively, the length of the second beam may be set to be longer than that of the first beam or the first beam may be formed to be convex upward and the second beam may be formed to be convex downward in order to set the scrub length of the second beam to be greater than that of the first beam.

Referring to FIG. 8 and FIG. 9, the inclination angles a1 and a2 are angles formed by imaginary lines in an extending portion where an imaginary line that connects an end portion of a connection portion of the first beam and an end portion of a contact portion and an imaginary line that connects an end portion of a connection portion of the second beam and an end portion of the contact portion are set to cross each other.

In the above-described cantilever-type micro contact probe, in the case of comparing before contact and after contact of the hinge structures between the extending portions 13, 23, 33, and 43 and the contact portions 15, 25, 35, and 45, only the first beams 13a, 23a, 33a, and 43a receive a load before contact, but the first beams 13a, 23a, 33a, and 43a receive the load together with the second beams 13b, 23b, 33b, and 43b after contact so that probe stiffness may be different before contact and after contact. Accordingly, the probes according to the exemplary embodiments of the present invention have variable stiffness by using the size of the gaps 14, 24, 34, and 44 of the hinge structures as design variables.

In addition, according to the cantilever-type micro contact probe of the exemplary embodiments of the present invention, the connection portions 11, 21, 31, and 41 and the extending portions 13, 23, 33, and 43 may be made of a metal material selected from a group including nickel, a nickel alloy, and phosphor bronze, and the contact portions 15, 25, 35, and 45 may be made of a metal material selected from a group including cobalt, a cobalt alloy, rhodium, a rhodium alloy, and an alloy thereof.

In addition, the cantilever-type micro contact probes according to the present exemplary embodiments can be manufactured by using an electrodeposition method so that a complex bellows shape or hinge structure can be easily manufactured.

In addition, the convex portions and the recess portions of the hinge portions are formed in a circular shape in FIG. 4 to FIG. 7, but they may be formed in polygonal shapes, such as an oval, a triangle, or a quadrangle as long as they can function as a hinge.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A cantilever-type micro contact probe that performs electrical examination of a semiconductor chip, comprising:
    a connection portion connected to a probe card;
    an extending portion extending in a side direction from the connection portion and having a dual beam shape;
    a contact portion having a tip formed to protrude from an end portion of the extending portion to contact a pad of the semiconductor chip; and
    a hinge portion that is provided between the extending portion and the contact portion and does not transmit a moment from the contact portion to the extending portion,
    wherein the hinge portion includes a convex portion and a recess portion that correspond to each other in shape, and the convex portion becomes the center of rotation when the micro contact probe is deformed due to external force and the recess portion guides the convex portion.

2. The cantilever-type micro contact probe of claim 1, wherein the hinge portion forms a gap between the convex portion and the recess portion so that the convex portion and the recess portion can be maintained being separated from each other when no external force is applied to the micro contact probe.

3. The cantilever-type micro contact probe of claim 1, wherein the hinge portion further comprises a protruding portion formed by being extended from the extending portion to surround the convex portion.

4. The cantilever-type micro contact probe of claim 1, wherein the extending portion comprises a first beam and a second beam arranged up and down, and an opening is formed between the first and second beams.

5. The cantilever-type micro contact probe of claim 4, wherein at least one of the first and second beams has a bellows shape that is bent while having at least one inflection point.

6. The cantilever-type micro contact probe of claim 5, wherein the hinge portion is formed between the second beam of the extending portion and the contact portion.

7. The cantilever-type micro contact probe of claim 5, wherein, in the extending portion, an imaginary line that connects an end portion of a connection portion of the first beam and an end portion of the contact portion and an imaginary line that connects an end portion of a connection portion of the second beam and an end portion of the contact portion are set to cross each other.

8. The cantilever-type micro contact probe of claim 4, wherein the hinge portion is formed between the second beam of the extending portion and the contact portion.

9. The cantilever-type micro contact probe of claim 8, wherein the hinge portion forms a hinge structure by having a convex portion and a recess portion that correspond to each other in shape and forming a gap between the recess portion and the convex portion, and maintains the second beam of the extending portion and the contact portion to be separated from each other when no external force is applied to the micro contact probe.

10. The cantilever-type micro contact probe of claim 9, wherein the hinge portion further comprises a protruding portion formed by being extended from the recess portion to surround to convex portion.

11. The cantilever-type micro contact probe of claim 9, wherein the convex portion is formed in one of the second beam of the extending portion and the contact portion, and the recess portion is formed in the other one.

12. The cantilever-type micro contact probe of claim 4, wherein, in the extending portion, an imaginary line that connects an end portion of a connection portion of the first beam and an end portion of the contact portion and an imaginary line that connects an end portion of a connection portion of the second beam and an end portion of the contact portion are set to cross each other.

13. The cantilever-type micro contact probe of claim 1, wherein the connection portion and the extending portion are made of a metal material selected from a group including nickel, a nickel alloy, and phosphor bronze, and the contact portion is made of a metal material selected from a group including cobalt, a cobalt alloy, rhodium, a rhodium alloy, and an alloy thereof.

14. A cantilever-type micro contact probe extending in a side direction and having a fixed first end and an unfixed second end, comprising a hinge structure that does not transmit a moment that is generated when an external load is applied to the second end of the micro contact probe, to the first end, wherein the hinge structure includes a convex portion and a recess portion that correspond to each other in shape, and the convex portion becomes the center of rotation when the micro contact probe is deformed due to external force and the recess portion guides the convex portion.

* * * * *